US005560423A

United States Patent [19]
Larson et al.

[11] Patent Number: 5,560,423
[45] Date of Patent: Oct. 1, 1996

[54] FLEXIBLE HEAT PIPE FOR INTEGRATED CIRCUIT COOLING APPARATUS

[75] Inventors: Ralph Larson, Bolton, Mass.; Richard J. Phillips, Alachua, Fla.

[73] Assignee: Aavid Laboratories, Inc., Laconia, N.H.

[21] Appl. No.: 282,068

[22] Filed: Jul. 28, 1994

[51] Int. Cl.$^6$ .................................................. F28D 15/00
[52] U.S. Cl. ................... 165/104.26; 361/703; 361/700; 257/715; 257/718; 257/719
[58] Field of Search ............................ 65/104.26, 104.33, 65/46; 361/700, 709, 710, 711, 703; 257/715, 718, 719

[56] References Cited

U.S. PATENT DOCUMENTS

| | | | |
|---|---|---|---|
| 3,256,703 | 6/1966 | Selwitz | 62/3 |
| 3,330,130 | 7/1967 | Schraith et al. | 62/259 |
| 3,613,778 | 10/1971 | Feldman, Jr. | 165/104.26 |
| 3,803,688 | 4/1974 | Peck | 165/104.26 X |
| 3,931,532 | 1/1976 | Byrd | 165/104.26 X |
| 4,212,347 | 7/1980 | Eastman | 165/104.26 X |
| 4,322,737 | 3/1982 | Sliwa, Jr. | 165/104.33 X |
| 4,339,929 | 7/1982 | Fitzpatrick et al. | 165/45 X |
| 4,448,239 | 5/1984 | Edwards | 165/104.21 X |
| 4,471,407 | 9/1984 | Sleder | 361/709 X |
| 4,563,375 | 1/1986 | Ulrich | 165/46 X |
| 4,794,982 | 1/1989 | Corkigian | 165/104.33 |
| 4,997,032 | 3/1991 | Danielson et al. | 165/46 |
| 4,997,034 | 3/1991 | Steffen et al. | 165/104.34 |
| 5,000,256 | 3/1991 | Tousignant | 165/46 |
| 5,006,924 | 4/1991 | Frankeny et al. | 357/82 |
| 5,046,552 | 9/1991 | Tousignant | 165/46 |
| 5,159,231 | 10/1992 | Feller et al. | 313/103 |
| 5,168,921 | 12/1992 | Meyer, IV | 165/104.26 X |
| 5,168,926 | 12/1992 | Watson et al. | 361/703 X |
| 5,205,348 | 4/1993 | Tousignant et al. | 165/46 |
| 5,373,099 | 12/1994 | Boitard et al. | 361/709 X |

FOREIGN PATENT DOCUMENTS

| | | |
|---|---|---|
| 0541456 | 10/1992 | European Pat. Off. . |
| 0200200 | 3/1983 | Germany .................. 361/703 |

OTHER PUBLICATIONS

F. E. Andros and F. A. Shott, *Flexible Heat Pipe*, IBM Technical Disclosure Bulletin, vol. 20, No. 11A, pp. 4313–4314, Apr. 1978.
2244 Research Disclosure, May, 1988, No. 289, New York, N.Y., USA.

Primary Examiner—John Rivell
Assistant Examiner—Christopher Atkinson
Attorney, Agent, or Firm—Bookstein & Kudirka, P.C.

[57] ABSTRACT

A heat pipe which is flexible and thus conformable to the space in which it is to be deployed consists of two or three layers, namely, a relatively thin, highly conductive plate as a bottom layer, a plastic sheet as a top layer and wicking as an optional middle layer. The bottom plate has a relatively high modulus of elasticity and it is stiff, yet ductile. It is preferably made of metal, such as aluminum, or a plastic sheet or plate. To manufacture the heat pipe, the bottom and top layers are aligned, with the wicking between them, and sealed together around three edges. Liquid coolant is then added and the fourth edge is sealed. The sealing is preferably performed by heat sealing. The heat pipe may include heat-dissipating fins or ridges on the end of the pipe that operates as a condenser. The opposing end of the pipe, which acts as the evaporator, is positioned proximate to a heat-generating component. In an alternative embodiment, additional layers of plastic and optional wicking are attached to an otherwise exposed surface of the bottom plate. The heat pipe is narrow and can thus be installed in existing space proximate to a heat generating component, flexing and/or elastically deforming as necessary to facilitate installation. Further, the heat pipe can be bent, to conform to the shape of the component.

28 Claims, 5 Drawing Sheets

5,560,423

FLEXIBLE HEAT PIPE FOR INTEGRATED CIRCUIT COOLING APPARATUS

FIELD OF THE INVENTION

This invention relates generally to an apparatus for cooling electronic components included on an integrated circuit and, in particular, to the construction of a heat pipe.

BACKGROUND OF THE INVENTION

Modern day electronic systems are compact and often include one or more high-power, high-density devices, such as microprocessors. As the functionality of these microprocessors increases, they are becoming more dense, operating at higher speeds and are, thus, producing more heat. The heat-generating devices are typically incorporated into one or more integrated circuits. Each integrated circuit, or die, is housed in a relatively flat circuit package, or housing. As used hereinafter, the term "chip" refers to the circuit package and the included die.

The high-power, high-density chips frequently cannot be adequately cooled by the conventional forced air cooling system used to cool the overall electronic system. Instead, these chips require their own, i.e., dedicated, cooling systems.

One type of dedicated cooling system uses a liquid coolant that changes phase as it absorbs and dissipates heat. The coolant changes from liquid to vapor as heat is transferred to it from the chip, and changes from vapor back to liquid as it dissipates the heat to the surrounding environment.

The coolant may be housed in a conventional heat pipe, which has one end that acts as an evaporator and an opposing end that acts as a condenser. The end of the pipe which acts as the evaporator is placed in thermal contact with the chip and conducts heat, through its walls, from the chip to the coolant. This causes the coolant to vaporize. The vapor then travels to the condenser end of the pipe. At this end, heat is dissipated from the vapor to the surrounding environment and the vapor condenses. A wick or other capillary device draws the condensed coolant back through the pipe to the evaporator, where heat is again transferred to it from the chip.

Conventional heat pipes are relatively rigid and may include expandable bellows that are also relatively rigid. These heat pipes can be bent, but large bending radii are required and thick effective cross-sections result. These conventional heat pipes thus can not be readily deformed, either elastically or plastically, to match the space constraints of the electronic system. If the heat pipe is, for example, metal, it generally can not be flexed or bent, even to facilitate installation. Accordingly, accessible space within the system, that is the size and shape of the pipe and proximate to the heat-generating chip, must be created to accommodate the pipe. As consumers demand smaller, more powerful systems, providing space for these rigid heat pipes becomes more and more of a problem.

Components other than those incorporated into the relatively flat circuit housings, for example, power transistors, which are generally cylindrical, may also require cooling. The conventional, rigid heat pipes are not readily configurable, and thus, custom, shaped, pipes must be specifically manufactured for these components. Such custom pipes are generally more expensive to produce.

What is needed is a heat pipe that can fit into relatively narrow spaces and can be readily shaped, elastically or plastically, to conform to existing space within a system and/or to the components that are not incorporated into the circuit housings.

It is expected that the high-power chips will be included in more and more devices, to accommodate consumer demand for faster, more powerful electronic systems. Accordingly, heat pipes will be included in more and more of these systems. The cost of manufacture of these heat pipes thus becomes a significant factor in the cost of manufacture and the pricing of the systems. Thus, what is needed is a heat pipe that is inexpensive to manufacture.

SUMMARY OF THE INVENTION

A heat pipe incorporating the invention is flexible and thus conformable to the space in which it is to be deployed. It consists essentially of three layers, namely, a relatively thin, highly conductive, preferably, metal, plate as a bottom layer, wicking as a middle layer and a plastic sheet as a top layer. A manufacturer aligns the bottom and top layers, with the wicking between them, seals the layers together around three edges, adds liquid coolant and seals the fourth edge. The heat pipe is thus relatively inexpensive to manufacture.

The assembled heat pipe is thin, with the bottom plate being the thickest component. Further, since the pipe cavity is formed between a bottom plate with a relatively high modulus of elasticity and a top sheet with a lower modulus of elasticity, the pipe is both flexurally and torsionally flexible. The bottom plate is however stiff, yet plastically deformable, such that the pipe can be readily flexed to facilitate installation into a narrow existing space proximate to a heat-generating chip and still retain its over-all shape. The pipe is also both bendable and ductile, or plastically deformable, such that it can be manipulated to conform essentially to the shapes of heat-generating components.

In an alternative embodiment, the bottom plate includes longitudinal ridges, which define channels for the condensed coolant. The plastic top sheet may be sealed to the tops of the ridges, such that the middle of the plastic sheet does not pull away from the bottom sheet when the pipe is bent or shaped. Alternatively, the plastic sheet may conform to, and thus, "move" with the ridges. A heat pipe with this ridged bottom plate may be positioned vertically within the system, such that the condensed coolant flows to the evaporator end of the pipe under gravity. In such an arrangement, the middle layer of wicking can be omitted. Alternatively, the channels can be sized to operate as capillary devices, also eliminating the need for the middle wicking layer.

One end of the multi-layer heat pipe is placed in thermal contact with the heat-generating chip. This end, which is the evaporator end, transfers heat from the chip to the liquid coolant contained in the pipe. The coolant vaporizes and flows to the other end of the pipe, which is the condenser end. This end dissipates the heat from the coolant to the surrounding environment, and the coolant condenses. The wicking or the channels, as appropriate, draws the condensed coolant back through the pipe to the evaporator end, where heat is again transferred to the coolant from the chip.

Adhesives, pads or tape may be included on the bottom, or exposed, surface of the bottom plate. The pipe can thus be readily attached to the heat-generating chip or component. Alternatively, the edges at one end of the bottom plate may be shaped to form spring clips, which can be used to secure the pipe to a chip. Since both the pipe and the clips are flexible, they can be easily manipulated to attach the pipe to the chip, without flexing, and potentially damaging, the chip. These clips may instead be attached to the end of the pipe, with similar results.

As appropriate, additional layers of wicking may be included in the pipe. Further, layers of plastic and wicking may be attached also to the opposite side of the bottom plate and liquid coolant added thereto, so that either or both sides of the heat pipe can be used to conduct heat from proximate chips or components. Multiple layers of wicking may be included on either or both sides, to increase the flow of condensed coolant from the condenser end of the pipe to the evaporator end of the pipe. Alternatively, the bottom plate may be replaced with a second plastic sheet.

BRIEF DESCRIPTION OF THE DRAWINGS

The above and further advantages of the invention may be better understood by referring to the following description in conjunction with the accompanying drawings, in which.

DETAILED DESCRIPTION OF ILLUSTRATIVE EMBODIMENTS

Figure 1:
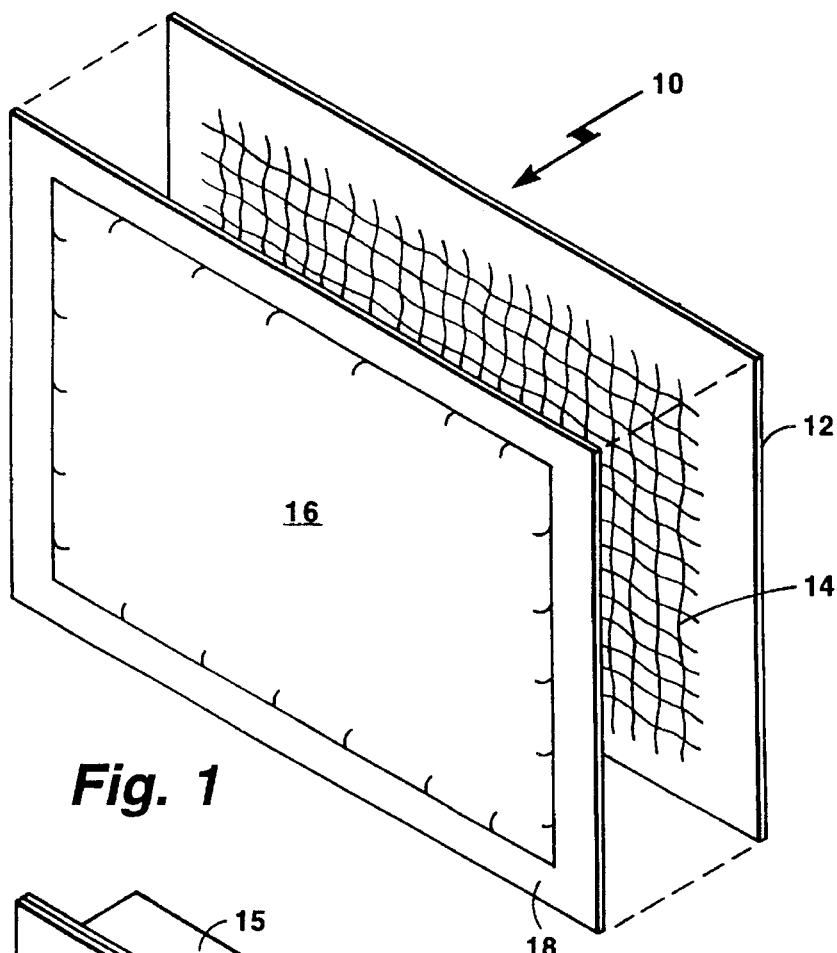
FIG. 1 is an exploded view of a flexible heat pipe including a plastic sheet as a top layer, an optional wicking layer and a deformable plate as a bottom layer.

FIG. 1 depicts a first embodiment of a flexible heat pipe 10 that includes a bottom layer, consisting of a thin, highly-conductive, preferably metal, bottom plate 12, a middle layer consisting of wicking 14 and a top layer consisting of a plastic sheet 16. The plastic sheet 16 and the bottom plate 12 are sealed together around their edges 18 with liquid coolant 13 (FIG. 2) contained between them. Preferably, the edges 18 are joined by heat sealing.

Figure 2:
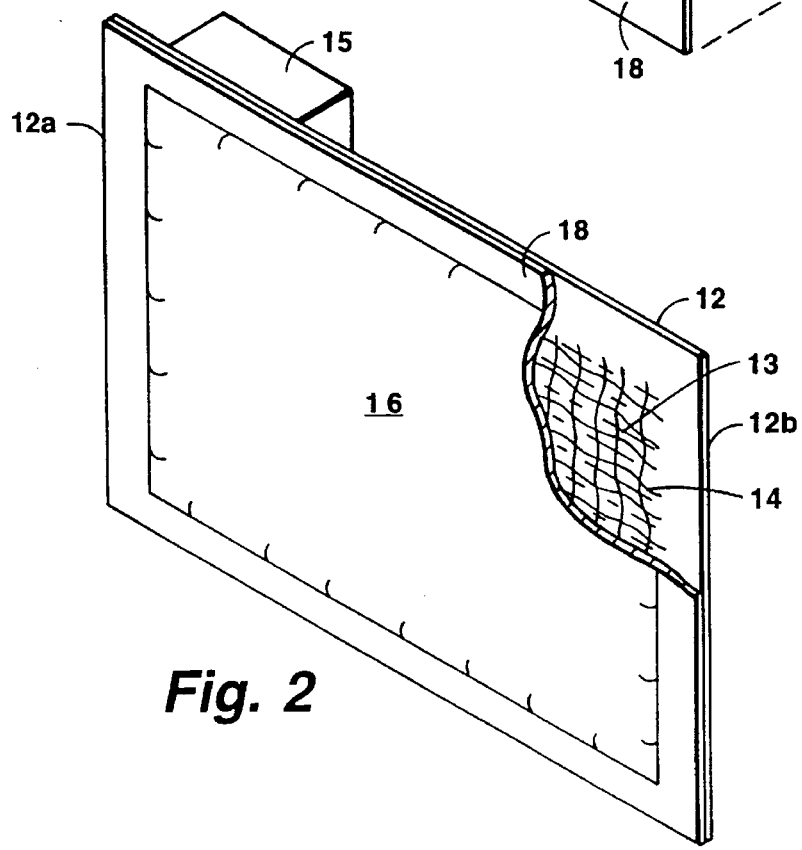
FIG. 2 is a front view of the heat pipe of FIG. 1.

Referring now also to FIG. 2, one end 12a of the flexible heat pipe 10, that is, the end that is in contact with a heat-generating chip 15, operates as an evaporator and an opposite end 12b operates as a condenser. At the evaporator end 12a, the pipe transfers heat from the chip 15 to the liquid coolant 13. The coolant absorbs heat, turns to vapor and the vapor flows to the condenser end 12b of the pipe. The condenser dissipates the heat from the vapor to the surrounding environment, which causes the coolant to condense. The wicking 14 draws the condensed coolant from the condenser to the evaporator.

To manufacture the heat pipe 10, the bottom plate 12 and the plastic top sheet 16 are heat sealed together around three edges, with the wicking in between. Liquid coolant is then added, or injected, and the fourth edge is sealed. The pipe is thus relatively easy and relatively inexpensive to manufacture. For example, high speed form, fill and seal equipment used in manufacturing flexible packaging, such as fast food ketchup packages, may be utilized to mass-produce these heat pipes.

The assembled heat pipe has a minimal thickness. The bottom plate 12 is approximately 0.001–0.125 inches thick and the plastic sheet 16 and the wicking 14 are essentially paper-thin. The bottom plate 12 is preferably made of a material, such as aluminum, which has a relatively-high elastic modulus. The plate is thus both and plastically deformable such that it both flexes and bends. Accordingly, it flexes as necessary during installation and retains its original shape, also it bends such that it can conform to a desired shape. The plate need not be metal, it may instead be made of a plastic sheet or plate, which does not crack as it bends.

Figure 3:
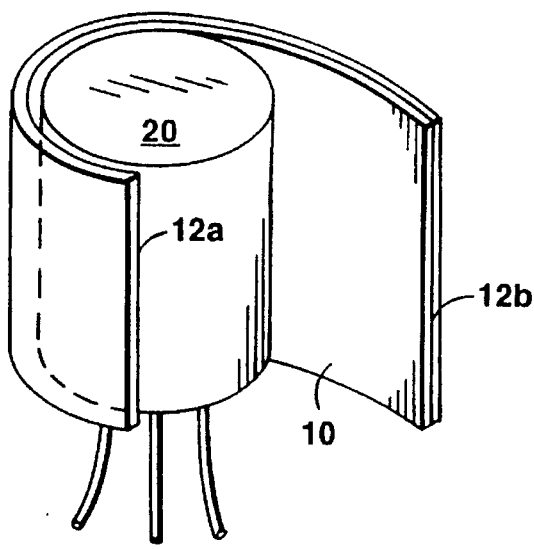
FIG. 3 depicts the heat pipe of FIG. 1 shaped around a cylindrical heat-generating component.
Figure 4:
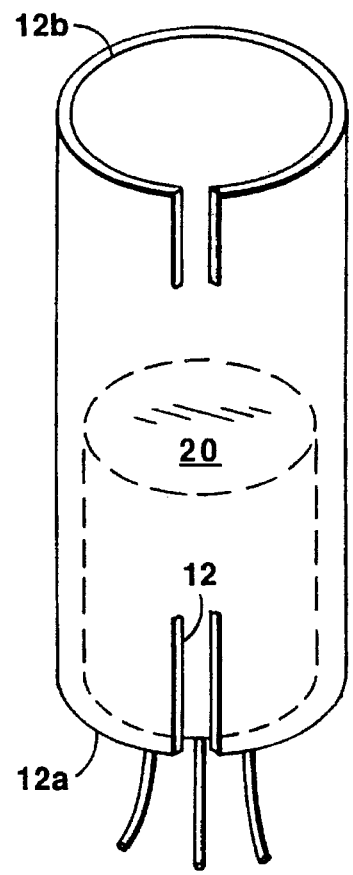
FIG. 4 depicts an alternative configuration of the heat pipe of FIG. 3.

FIG. 3 depicts the heat pipe 10, bent, to conform partially to the shape of a cylindrical heat-generating component 20. One end of the pipe 10, which operates as the evaporator, is manipulated or shaped to fit around the component 20, while the opposite end 12b of the pipe, which operates as the condenser, extends outwardly from the component, to provide a relatively large surface for heat dissipation. Alternatively, as depicted in FIG. 4, the heat pipe can be fully conformed to the shape of the component 20, and extend above the component. The upwardly extending end acts as the condenser, while the end wrapped around the component acts as the evaporator.

Figure 5:
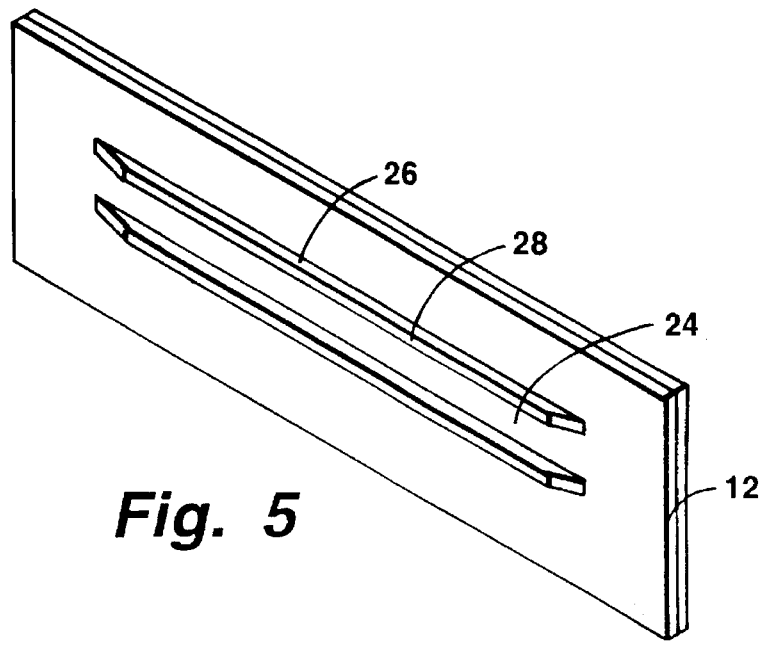
FIG. 5 depicts a bottom view of a flexible heat pipe of FIG. 1, formed with a bottom plate that includes longitudinal channels for directing liquid coolant.

As depicted in FIG. 5, the bottom plate 12 may include longitudinal ridges 26 that define channels 24. These channels 24 direct condensed coolant, under gravity, from the condenser to the evaporator. This pipe must be properly oriented in the electronic system, when the system is in use if gravity drives the return of the condensed coolant. The channels 24 may instead by sized to function as a capillary device, to either supplement or supplant the wicking, such that gravity does not drive the return of the coolant. Such a pipe need not be installed or operated in any particular orientation.

The ridges 26 may be stamped into the bottom plate 12 during manufacture. These ridges 26, and thus, the channels 24, need not be straight. They can, for example, be shaped to direct the coolant to particular hot spots of an associated device.

The plastic top sheet 16 may be sealed to the tops 28 of the ridges 26, to hold the sheet in close proximity to the bottom plate. Alternatively, the top sheet 16 may conform to the ridges, and essentially "move" with them when the pipe is bent or shaped.

Figure 6:
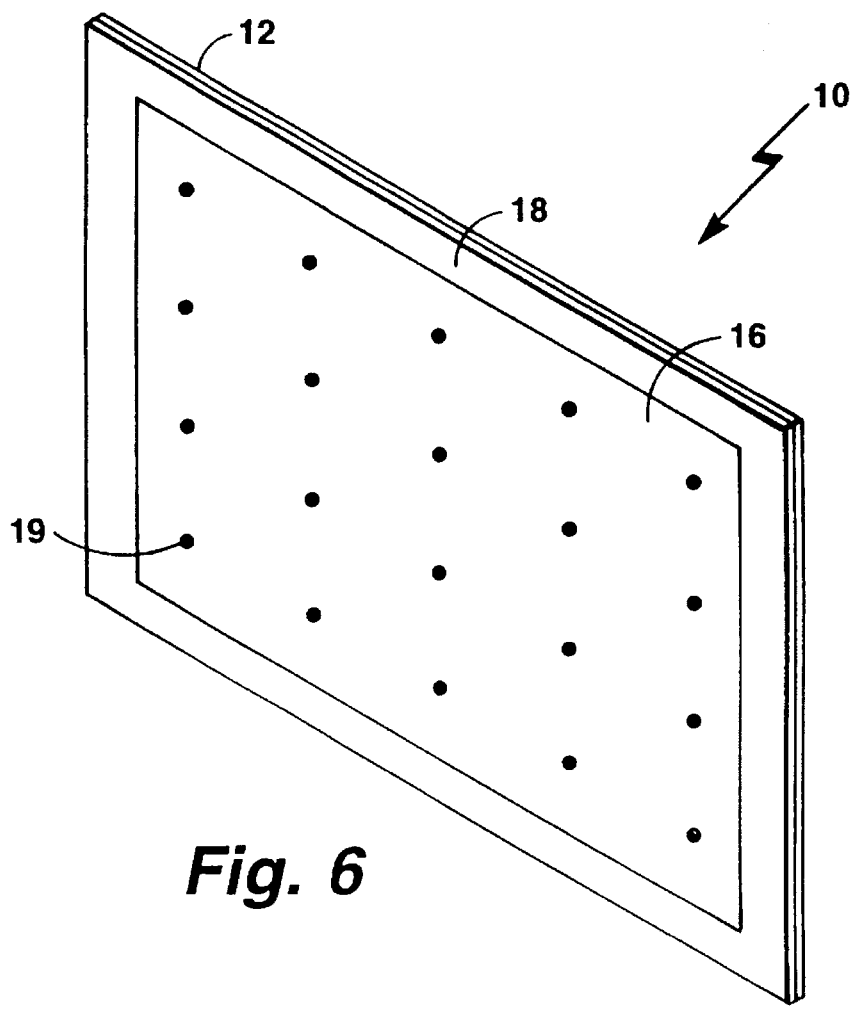
FIG. 6 is a top view of the heat pipe of FIG. 1, with a top sheet that is attached to the bottom plate at a plurality of interior points.

FIG. 6 depicts a heat pipe 10 with a plastic top sheet 16 that is sealed to the bottom plate 12, in addition to the edges 18, at various points 19 over the surface of the plate. If wicking is included in the pipe 10, the wicking is also sealed to the bottom plate at the points 19. The plastic sheet and wicking, as appropriate, thus remain in full and complete contact with the bottom plate, regardless of how that plate is manipulated.

Figure 7:
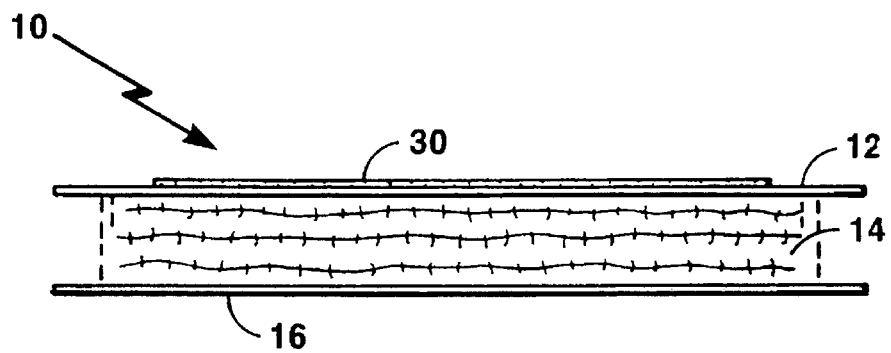
FIG. 7 is an exploded side view of an alternative embodiment of the heat pipe of FIG. 1, this embodiment includes multiple layers of wicking material and an adhesive on an exposed surface of the bottom sheet.

FIG. 7 is a cross-sectional view of a heat pipe 10 that includes the top and bottom layers 16 and 12 and a wicking layer 14 with multiple sheets. This heat pipe 10 also includes a strip 30 of adhesive on an exterior surface of the bottom plate 12. This strip 30 adheres to the heat-generating component, to secure the heat pipe in place. The strip 30 may be a tape, one or more sticky pads, or a stripe of glue or epoxy, as appropriate.

Figure 8:
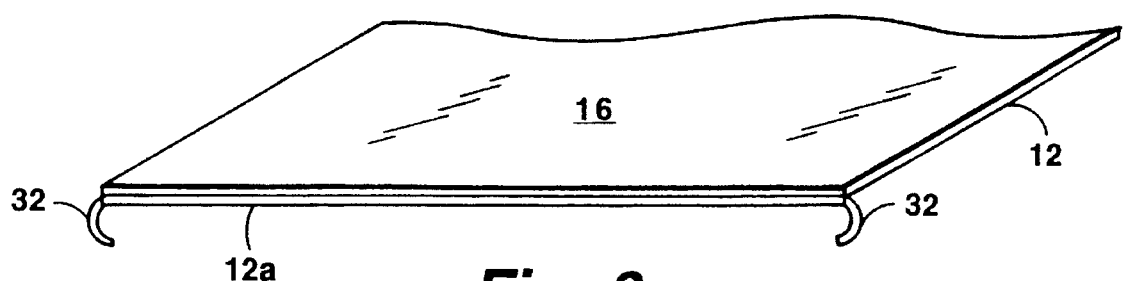
FIG. 8 is a side view of the heat pipe of FIG. 1 with clips on one end, for attaching the pipe to a heat-generating component.

FIG. 8 depicts the heat pipe 10 with spring clips 32 formed on the bottom plate 12 at the end 12*a* that operates as the evaporator. Alternatively, the clips 32 may be formed separately and affixed to the end 12*a*. The spring clips 32 can be used to secure the pipe to the heat-generating device. Since the heat pipe 10 is flexible, it bends and flexes as the clips are manipulated to attach the pipe to the device. With inflexible heat pipes, the device may be forced to bend or flex as the clips are installed around the device, which may result in the cracking of the device. Additional clips may be formed on or affixed to the opposite end 12*b* of the heat pipe (not shown) and used to secure the condenser end.

Figure 9:
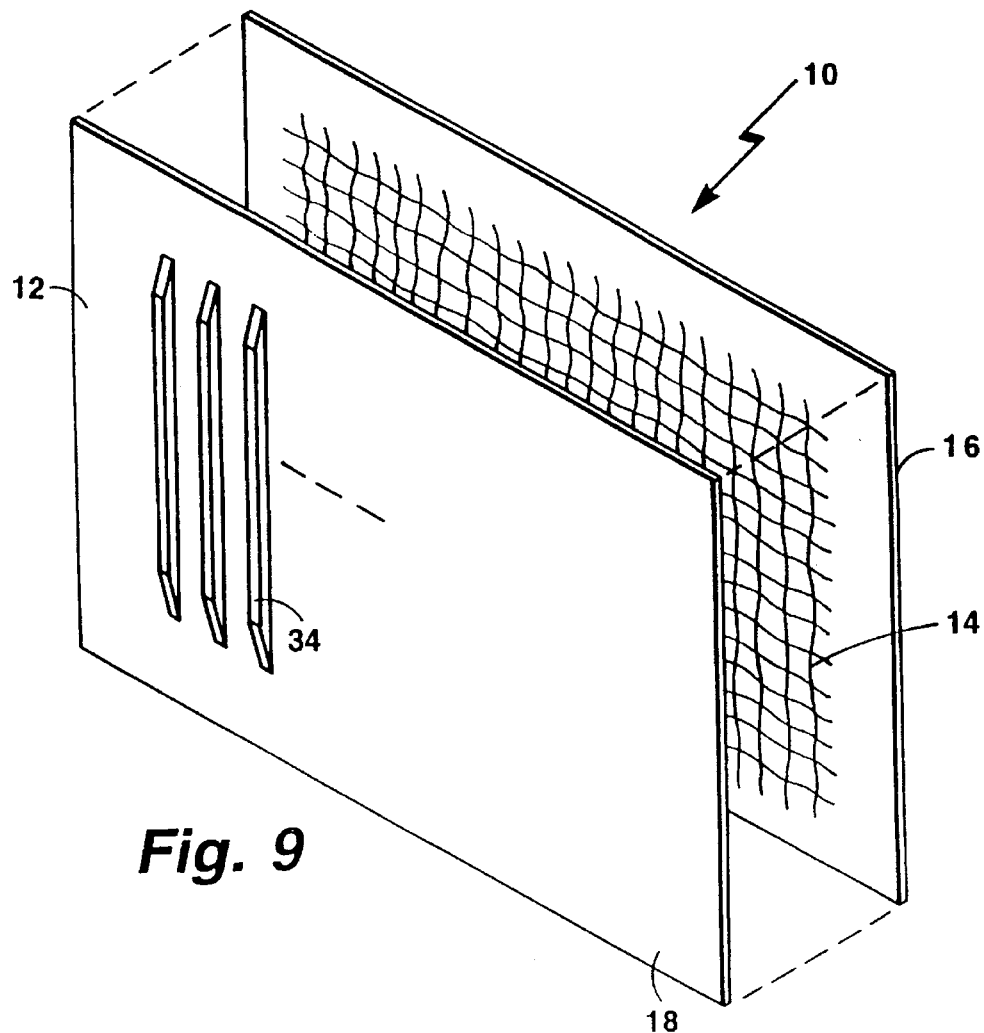
FIG. 9 depicts the heat pipe of FIG. 1 with external ribs.
Figure 10:
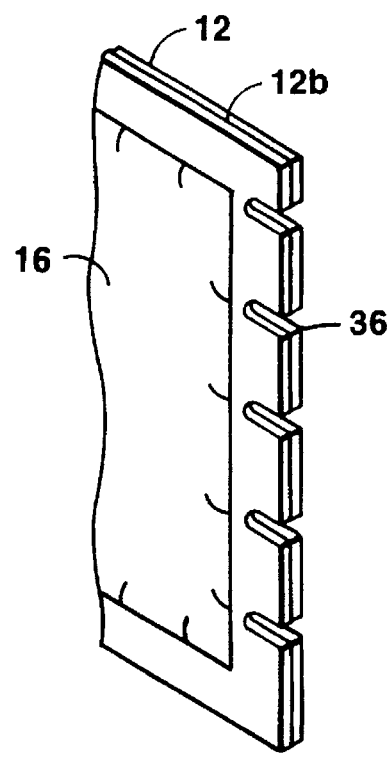
FIG. 10 depicts the heat pipe of FIG. 1 with integral fins.

FIG. 9 depicts the heat pipe 10 with heat dissipating ribs 34. These ribs increase the surface area of the condenser and thus promote heat dissipation. FIG. 10 depicts the heat pipe 10 with fins 36 integral to the condenser end 12*b* of the pipe. These fins 36 increase the surface area of the end 12*b*, to promote heat dissipation. The fins 36 may also be shaped to extend, for example, into air flow paths within the system.

Figure 11:
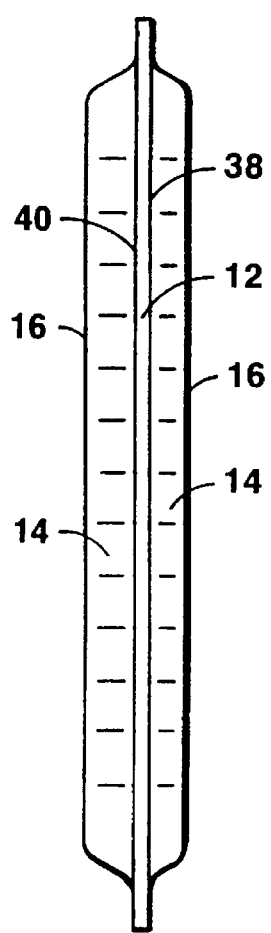
FIG. 11 depicts the heat pipe of FIG. 1 with additional layers.

FIG. 11 depicts the heat pipe 10 with plastic sheets 16 and wicking 14 attached to both a top surface 38 and a bottom surface 40 of the bottom plate 12. The heat pipe 10 can thus cool devices or components that are proximate to either or to both sides of the pipe.

The heat pipes described above are easily and inexpensively manufactured. These pipes are extremely thin and readily manipulated for installation into existing spaces in the electronic system. Further, the pipes can be shaped to conform to heat-generating components. Thus pipes in custom shapes need not be produced. The pipes may also be used with flexible circuit boards, since the pipes accommodate the flexing of the boards.

The foregoing description has been limited to a specific embodiment of this invention. It will be apparent, however, that variations and modifications may be made to the invention, with the attainment of some or all of its advantages. Therefore, it is the object of the appended claims to cover all such variations and modifications as come within the true spirit and scope of the invention.

What is claimed is:

1. A heat pipe for cooling a heat-generating component, the heat pipe including:
   a bottom layer that includes a flexible plate having a high thermal conductivity, the bottom layer having a relatively high modulus of elasticity;
   a middle layer that includes a sheet of material that acts as wicking;
   a top layer having a relatively low modulus of elasticity, said top layer being sealed to the bottom layer; and
   liquid coolant contained between the top and bottom layers.

2. The heat pipe of claim 1 wherein the bottom layer includes an aluminum plate.

3. The heat pipe of claim 1 wherein the bottom layer includes a top surface to which the top layer is attached and a bottom surface which is exposed, the heat pipe further including an adhesive strip attached to the bottom surface of the bottom layer, the adhesive securing the heat pipe to the heat-generating component.

4. The heat pipe of claim 1 wherein the bottom layer includes a first end and a second end and the heat pipe further includes clips that are attached to the first end of the bottom layer, the clips securing the first end of the heat pipe to a heat-generating component.

5. The heat pipe of claim 1 wherein the bottom layer includes a first end and a second end and the first end is formed into a spring clip, for securing the first end to a heat-generating component.

6. The heat pipe of claim 1 wherein the bottom layer includes a plurality of longitudinal ridges that define channels, which direct the flow of condensed coolant.

7. A component cooling system including:
   a heat-generating component;
   a flexible heat pipe with a first end and a second end, the first end of the heat pipe in thermal communication with the heat-generating component, the heat pipe including:
   i. a bottom layer that includes a plate of high thermal conductivity, the plate having a top surface and a bottom surface and having a relatively high modulus of elasticity;
   ii. a top layer that includes a plastic sheet and has a relatively low modulus of elasticity, said top layer being sealed to the top surface of the bottom layer; and
   iii. liquid coolant contained between the top and bottom layers, the coolant capable of absorbing heat from the heat-generating component.

8. The heat pipe of claim 7 further including a layer of wicking between the top and bottom layers, the wicking drawing the condensed coolant from the second end to the first end.

9. The heat pipe of claim 7 wherein the bottom layer includes a plurality of longitudinal ridges that define channels, which direct the flow of condensed coolant.

10. The heat pipe of claim 7 wherein the bottom layer consists of a thin plate of aluminum.

11. The heat pipe of claim 7 wherein the bottom layer comprises a plastic sheet.

12. The heat pipe of claim 8 wherein the plastic sheet is attached to the ridges by hermetically sealing the sheet to a top surface of each ridge.

13. The heat pipe of claim 8 further including at the second end of the bottom layer external ribs, which aid in heat dissipation.

14. The heat pipe of claim 8 further including at the second end of the bottom layer heat dissipating fins, which aid in heat dissipation.

15. The heat pipe of claim 14, wherein the fins are integral to the second end of the bottom layer the heat pipe.

16. The heat pipe of claim 7 further including an additional layer consisting of an additional plastic sheet, the additional plastic sheet being sealed to the bottom surface of the bottom layer, with liquid coolant contained between the additional plastic sheet and the bottom layer.

17. The heat pipe of claim 16 further including wicking between the bottom layer and the top layer.

18. The heat pipe of claim 17 further including wicking between the bottom layer and the additional plastic sheet.

19. The heat pipe of claim 7 wherein the bottom layer includes a first end and a second end and the first end is formed into a spring clip for attaching the first end to a heat-generating component.

20. The heat pipe of claim 19 wherein the second end of the heat pipe is formed into a clip.

21. The heat pipe of claim 7 wherein the bottom layer comprises a metal plate.

22. The heat pipe of claim 7 wherein the bottom layer comprises a plastic sheet.

23. The heat pipe of claim 22 further including a middle layer consisting of one or more sheets of wicking.

24. The heat pipe of claim 21 further including a middle layer consisting of one or more sheets of wicking.

25. The heat pipe of claim 7 wherein the plate forming the bottom layer includes channels that provide capillary action between a first end of the heat pipe that operates as a condenser and a second end that operates as an evaporator.

26. The heat pipe of claim 25 wherein the heat pipe includes a middle layer consisting of one or more sheets of wicking.

27. A heat pipe for cooling a heat-generating component, the heat pipe including:

a bottom layer that includes a thin, highly conductive flexible plate having a relatively high modulus of elasticity, the plate including a top surface and a bottom surface;

a top layer that includes a thin flexible plastic sheet having a relatively low modulus of elasticity, said top layer being sealed to the top surface of the bottom layer; and liquid coolant contained between the top and bottom layers.

28. The heat pipe of claim 27 further including a middle layer consisting of one or more sheets of wicking.

\* \* \* \* \*